US008086985B2

(12) United States Patent
Qiu

(10) Patent No.: US 8,086,985 B2
(45) Date of Patent: Dec. 27, 2011

(54) AUTOMATIC ALIGNMENT OF MACRO CELLS

(75) Inventor: Li Qiu, Pal Alto, CA (US)

(73) Assignee: QUALCOMM Incorporated, San Diego ( * ) Notice: Subject to any disclaimer, the term of this patent is extended or adjusted under 35 U.S.C. 154(b) by 560 days.

(21) Appl. No.: 12/235,817

(22) Filed: Sep. 23, 2008

(65) Prior Publication Data

US 2010/0077374 A1    Mar. 25, 2010

(51) Int. Cl.
  *G06F 17/50* (2006.01)
(52) U.S. Cl. .................. 716/119; 716/118; 716/120
(58) Field of Classification Search .................. 716/118, 716/119, 120, 122
  See application file for complete search history.

(56) References Cited

U.S. PATENT DOCUMENTS

| 5,754,826 | A | 5/1998 | Gamal et al. | |
|---|---|---|---|---|
| 2005/0138595 | A1 | 6/2005 | Khakzadi et al. | |
| 2008/0178135 | A1* | 7/2008 | Wu et al. ........................... | 716/8 |
| 2010/0229140 | A1* | 9/2010 | Strolenberg et al. .............. | 716/9 |

OTHER PUBLICATIONS

International Search Report and Written Opinion—PCT/US2009/057440—International Search Authority—European Patent Office, Jan. 11, 2010.
Sapatnekar S. S., et al., "Congestion-Aware Topology Optimization of Structured Power/Ground Networks," IEEE Transactions on Computer Aided Design of Integrated Circuits and Systems, IEEE Service Center, Piscataway, NJ, US, vol. 24, No. 5, May 1, 2005, pp. 683-695, XP011130814.
Singh J., et al., "A fast Algorithm for power grid design," Proceedings of the International Symposium on Physical Design—Proceedings of ISPD ' May 2005 International Symposium on Physical Design 2005 Association For Computing Machinery US, 2005, pp. 70-77, XP002561674.
Singh J., et al., "Partition-based Algorithm for Power Grid Design Using Locality," IEEE Transactions on Computer-Aided Design of Integrated Circuits and Systems IEEE, USA, vol. 25, No. 4, Apr. 2006, pp. 664-677, XP002561675.
International Search Report and Written Opinion—PCT/US2009/057440—International Search Authority—European Patent Office, Jan. 11, 2010.
Sapatnekar S. S., et al., "Congestion-Aware Topology Optimization of Structured Power/Ground Networks," IEEE Transactions on Computer Aided Design of Integrated Circuits and Systems, IEEE Service Center, Piscataway, NJ, US, vol. 24, No. 5, May 1, 2005, pp. 683-695, XP011130814.
Singh J., et al., "A fast Algorithm for power grid design," Proceedings of the International Symposium on Physical Design—Proceedings of ISPD ' May 2005 International Symposium on Physical Design 2005 Association For Computing Machinery US, 2005, pp. 70-77, XP002561674.
Singh J., et al., "Partition-based Algorithm for Power Grid Design Using Locality," IEEE Transactions on Computer-Aided Design of Integrated Circuits and Systems IEEE, USA, vol. 25, No. 4, Apr. 2006, pp. 664-677, XP002561675.

* cited by examiner

*Primary Examiner* — Stacy Whitmore
*Assistant Examiner* — Magid Dimyan
(74) *Attorney, Agent, or Firm* — Sam Talpalatsky; Michelle Gallardo; Jonathan T. Velasco

(57) ABSTRACT

In a particular embodiment, a method is disclosed that includes detecting a first pitch between at least two lines (e.g. a power line and a ground line) of a first reference macro. The method also includes generating a virtual grid based on the first pitch and aligning at least a second macro to the virtual grid.

27 Claims, 9 Drawing Sheets

AUTOMATIC ALIGNMENT OF MACRO CELLS

I. FIELD

The present disclosure is generally related to integrated circuit (IC) design methods.

II. DESCRIPTION OF RELATED ART

The design of a logic function on an integrated chip that specifies how the required logic elements are interconnected and specifies the physical pathways and wiring patterns between the components is a macro cell. Macro cells cover a range from a large block, such as a read only memory (ROM) section and random access memory (RAM) section, to a block of small circuit size of which various kinds of logic units are configured. Macro cells require their own internal power and ground grid to ensure sufficient power supply for proper functionalities.

In general, in integrated circuit (IC) designs including application-specific integrated circuit (ASIC) and system-on-chip (SoC) designs, there are typically two levels of the power distribution network for integrated circuit design. The first is the main power and ground network (power grid) which is external to the macro cells and the second is the internal power and ground lines of the macro cells. To ensure functionalities of ICs, it is required to provide solid power/ground connections between the second grid (macro cell's power and ground grid) to the first and main power/ground grid of the ICs.

This requirement can be satisfied if the internal power and ground grid of individual macro cells is designed in such a way that all of the macro cells can be connected together to form a continuous power and ground sub grid. For this purpose, a) the internal power and ground grid of individual macros cells can be constructed with a consistent pattern of pitches and widths for their power and ground grid, and b) macro cells can be placed in such a way that their power and ground grid are aligned among themselves.

III. BRIEF DESCRIPTION OF THE DRAWINGS

IV. SUMMARY

Figure 1:
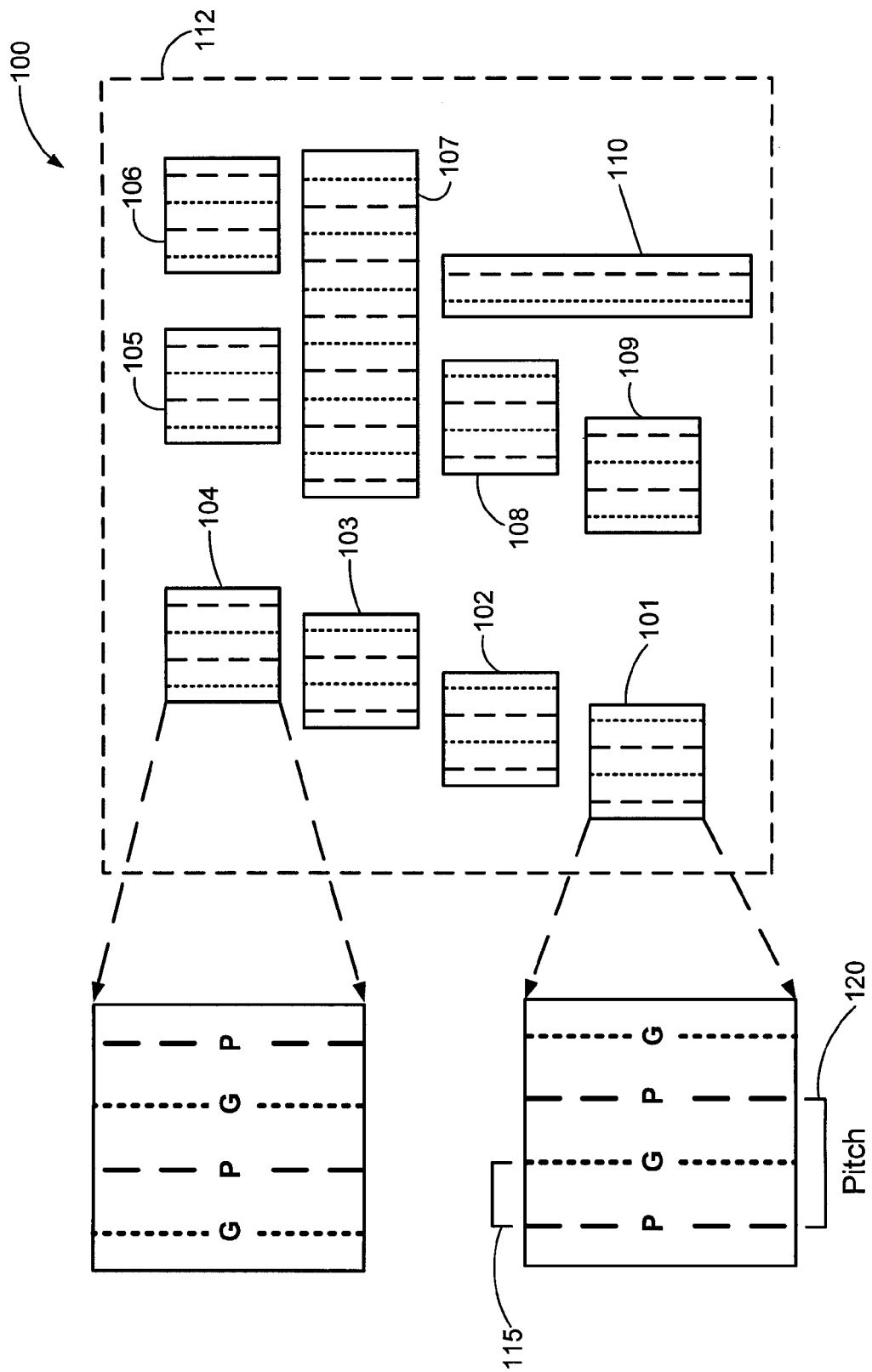
FIG. 1 is a diagram of a particular embodiment of an integrated circuit design having a plurality of macro cells in which one of the macro cells has been designated as a reference macro.

A virtual power grid may be generated for an integrated circuit design. Macro cells of the integrated circuit design may be searched to check for internal power and ground grids (including one or more power lines and ground lines) that are not aligned to the virtual grid and adjustments may be made automatically.

In a particular embodiment, a method is disclosed that includes determining one or more parameters of a reference macro, the reference macro could be a memory macro of an integrated circuit design. The method includes generating a virtual grid based upon the parameters of the reference macro. The method further includes calculating a displacement and detecting an orientation of one or more other macro cells of the integrated circuit design relative to the virtual grid. The method includes aligning the one or more other macro cells to the virtual grid based on their orientations and the calculated displacements. For example, the reference macro may be automatically determined by default or may be a user-selected macro. As another example, the reference macro may be a virtual reference macro that is generated based upon a user-specified set of one or more parameters representing the virtual reference macro.

In another embodiment, the method includes detecting a first pitch between at least two lines (e.g., a power line and a ground line) corresponding to a first reference macro. The method also includes generating a virtual grid based on the first pitch and aligning at least a second macro to the virtual grid.

In another embodiment, a processor-readable medium is disclosed. The processor-readable medium includes processor executable instructions that are operative to cause a processor to designate one of a plurality of macro cells of an integrated circuit design as a reference macro. The processor executable instructions are also operative to cause the processor to determine one or more parameters of the reference macro and to automatically generate a virtual grid of power lines based on the one or more parameters of the reference macro. The processor executable instructions are further operative to cause the processor to automatically align at least one other macro cell to the virtual grid.

In another embodiment, an integrated circuit (IC) design tool is disclosed. The IC design tool includes a processor and a memory coupled to the processor. The memory stores macro cell power grid alignment instructions that are executable to cause the processor to designate a macro cell of a plurality of macro cells of an IC design as a reference macro. The macro cell power grid alignment instructions are also executable to cause a processor to determine one or more parameters of the reference macro and to automatically generate a virtual grid of power lines based on the one or more parameters of the reference macro. The macro cell power grid alignment instructions are further executable to automatically align at least one other macro cell to the virtual grid.

In another embodiment, a device is disclosed that includes an integrated circuit that is at least partially formed using the disclosed integrated circuit design tool.

One particular advantage provided by various disclosed embodiments is to automatically provide a continuous internal power grid between macro cells of an IC design using an automated design tool.

Other aspects, advantages, and features of the present disclosure will become apparent after review of the entire application, including the following sections: Brief Description of the Drawings, Detailed Description, and the Claims.

V. DETAILED DESCRIPTION

FIG. 1 is a diagram of a particular embodiment of an integrated circuit (IC) design 100 having a plurality of macro cells 101-110 in which one of the macros 101 has been designated as a reference macro. Macro cells 101-110 are within an IC design boundary 112. Each macro 101-110 has an internal power grid including one or more power lines and ground lines. The internal power grid of macro cells 101 and 104 are also shown in greater detail in FIG. 1. The power lines of the internal power grid of the macro cells 101-110 are shown as dashed lines P, and the ground lines of the internal power grid of the macro cells 101-110 are shown as dotted lines G. Each of the macro cells 101-110 has a power-to-ground pitch 115, which is the distance between a power line P and a ground line G of the internal grid of the macro cell. Each of the macro cells 101-110 also has a power-to-power pitch 120, which is the distance between two adjacent power lines P of the internal grid of the macro cell. The power-to-ground pitch 115 and the power-to-power pitch 120 may be the same for all of macro cells 101-110, as illustrated in FIG. 1, or may differ among the macro cells 101-110. For example, the macro cell 102 may have a power-to-ground pitch that is different than a power-to-ground pitch the macro cell 103, or the macro cell 102 may have a power-to-power pitch that is different than the power-to-power pitch of the macro cell 103, or both the power-to-power and power-to-ground pitch may be different. In this particular example, the macro cells 102, 104, and 105 could belong to a group of macro cells having the same pitches 115 and 120, while the macro cells 106-110 may have pitches 115 and 120 that match the macro cell 103.

Each of the macro cells 101-110 also has a polarity or orientation in regard to the position of its power lines and ground lines as well as the offset of its left-most line. As shown in FIG. 1, macro cells 101, 102, 103, 107 and 108 have an orientation having a power line on the left side (i.e., as the left-most line), while macro cells 104, 105, 106, 109 and 110 have an opposite orientation having a ground line on the left side. The offset of the left-most line to the left edge of the macro cell could be different as well.

In a particular embodiment, one of the pluralities of macro cells is designated as a reference macro. For example, the macro cell located in a lower left corner of the IC design may be designated as the reference macro, such as the macro cell 101 of the IC design 100. In another embodiment, a macro cell located in a lower-right corner of the IC design may be designated as a reference macro. In general, for different embodiments, any of the plurality of macro cells may be designated as a reference macro and such designation may be automatic or user-specified. Once a macro cell has been designated as the reference macro, its position, orientation, and pitch are detected. By generating a virtual grid based on the reference macro 101, other macro cells 102-110 can be aligned automatically. In a particular embodiment, more than one virtual grid may be generated. For example, in case of different power-to-ground pitch 115 or power-to-power pitch 120 for at least one of the macro cells 101-110, more than one virtual grid could co-exist.

Figure 2:
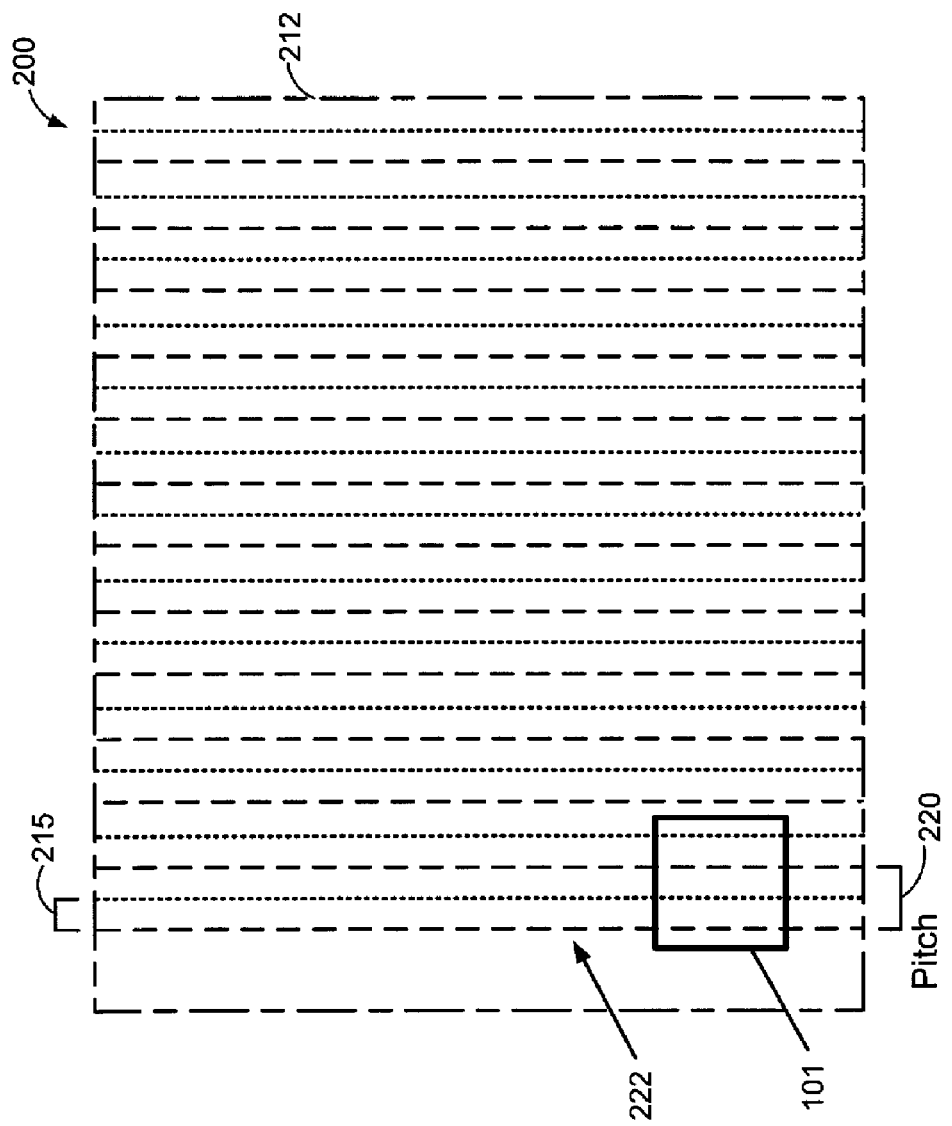
FIG. 2 is a diagram of a particular embodiment of a virtual power grid for the integrated circuit design shown in FIG. 1.

FIG. 2 is a diagram of a particular embodiment of a virtual power grid 200 for the integrated circuit (IC) design 100 shown in FIG. 1. The power lines of the virtual power grid 200 are shown as dashed lines and the ground lines of the virtual power grid 200 are shown as dotted lines. In a particular embodiment, the virtual power grid 200 extends across the entire IC design 100 and has a boundary 212 coincident with boundary 112 of the IC design 100 shown in FIG. 1. In general, however, the boundary 212 doesn't need to be coincident with the boundary 112. The virtual power grid 200 is automatically generated based on the detected position, pitch, and orientation of the reference macro 101. Therefore, the power-to-ground pitch 215 of the virtual power grid 200 is substantially equal to the power-to-ground pitch 115 of the reference macro 101, and the power-to-power pitch 220 of the virtual power grid 200 is substantially equal to the power-to-power pitch 120 of the reference macro 101. The virtual power grid 200 has an orientation having a power line on the left side to match the orientation of the reference macro 101. The left side power line 222 of the virtual power grid 200 is offset from the boundary 212 by the same amount that the left side power line of the reference macro 101 is offset from boundary 112 as shown in FIG. 1.

For an embodiment in which the successive power and ground lines of the reference macro are equally distant, the virtual power grid 200 can be generated based upon one of the power-to-ground pitch or power-to-power pitch of the reference macro. For such an embodiment, the power-to-power pitch is twice the power-to-ground pitch. For embodiments in which the successive power and ground lines of the reference macro are not equally distant, the virtual power grid is generated based upon both the power-to-ground pitch and the power-to-power pitch of the reference macro.

In a particular embodiment, in which the orientation of any of the plurality of macro cells 101-110 may be different from each other, the virtual power grid 200 is generated based on the detected orientation of the reference macro 101. Therefore, the orientation of virtual power grid 200 is the same as reference macro 101, which has a power line as the left-most line in the embodiment depicted in FIGS. 1-2.

In a particular embodiment, after generation of the virtual power grid, the pitch of other macro cells of the IC design is detected. Each macro cell having a pitch that matches the pitch of the reference macro is aligned to the virtual power grid. Automatic alignment of macro cells to the virtual power grid simplifies connection of the internal power grids of adjacent macros in comparison to non-automated techniques. In addition, automatic alignment by a computer assisted design tool enables a uniformity and precision of macro alignment exceeding that attainable via manual techniques in the same amount of time.

Figure 3:
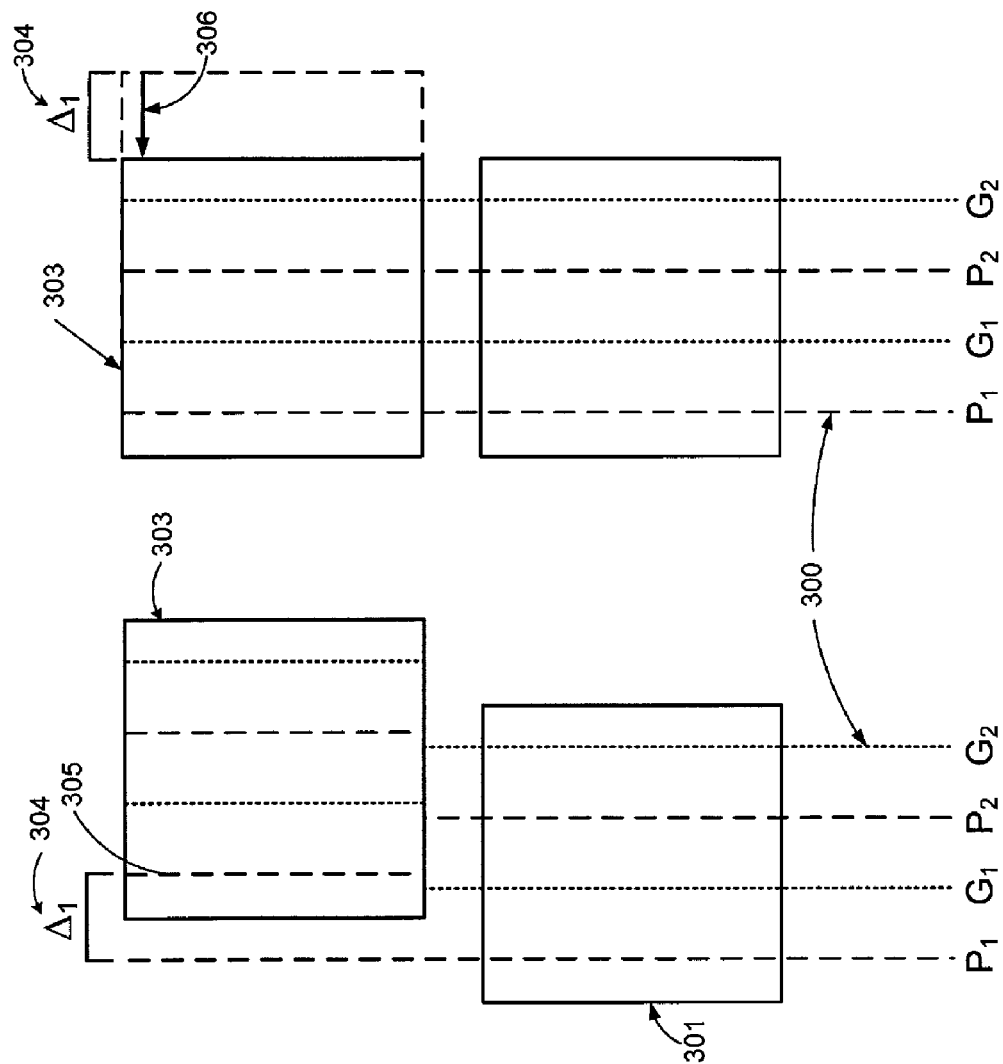
FIG. 3 is a diagram that depicts alignment of macro cells of an integrated circuit design with a virtual power grid.

FIG. 3 is a diagram of particular example illustrating alignment of macro cells of an integrated circuit (IC) design using a virtual power grid. As shown in FIG. 3, macro cell 301, which may be the reference macro, is aligned to the virtual power grid 300, shown in-part by power and ground lines $P_1$, $G_1$, $P_2$, and $G_2$. Another macro cell 303 is originally displaced from alignment with the virtual power grid 300 by a distance $\Delta_1$ 304. In a particular embodiment, the displacement between the power line 305 on the macro cell 303 and the closest line $P_1$ of the virtual power grid 300 having the same orientation is calculated. The macro cell 303 is then moved or shifted the calculated distance in order to effect alignment of the macro cell 303 with the virtual power grid 300. As shown in FIG. 3 the macro cell 303 is shifted by the distance $\Delta_1$, shown as shift 304, so that it is aligned with the virtual power grid 300 thereby enabling an efficient power connection process between the internal power grids of the macro cell 301 and the macro cell 303. In a particular embodiment, the operation of aligning macro cells to the virtual power grid is extended across the whole IC design. Although in a particular embodiment, the distance $\Delta_1$ 304 is calculated, in other embodiments the macro cell 303 may be aligned to the virtual grid 300 without calculating a value of the distance $\Delta_1$ 304. For example, a line of the virtual grid may be selected and coordinates of the macro cell 303 may be automatically changed to coincide with the location of the selected line of the virtual grid, without performing a distance calculation.

Macro cells, even those designed to have the same pitch, may have differing internal offsets. Therefore, if a macro cell with a large internal offset relative to the reference macro was moved to the closest line of the virtual grid having the same orientation, the edge of the macro cell may be moved beyond the IC design boundary. In a particular embodiment, the offset of each of the macro cells is determined and if the alignment to the closest line of the virtual grid having the same orientation would move a macro cell beyond the boundary of the IC design, an alternative alignment is made. For example, where a shift toward a left boundary causes a particular macro to extend beyond the left boundary, the macro may be shifted right instead. In addition, an alternative alignment may be made when moving a macro cell to the closest line of the virtual grid causes an overlap with another macro cell. For example, where a shift toward a left boundary causes a particular macro cell to overlap with another macro cell, the particular macro cell may be shifted right instead. In a case where a macro cell cannot be aligned to the virtual grid without overlapping with another cell or moving beyond a boundary of the IC design, a warning may be issued to alert users.

Figure 4:
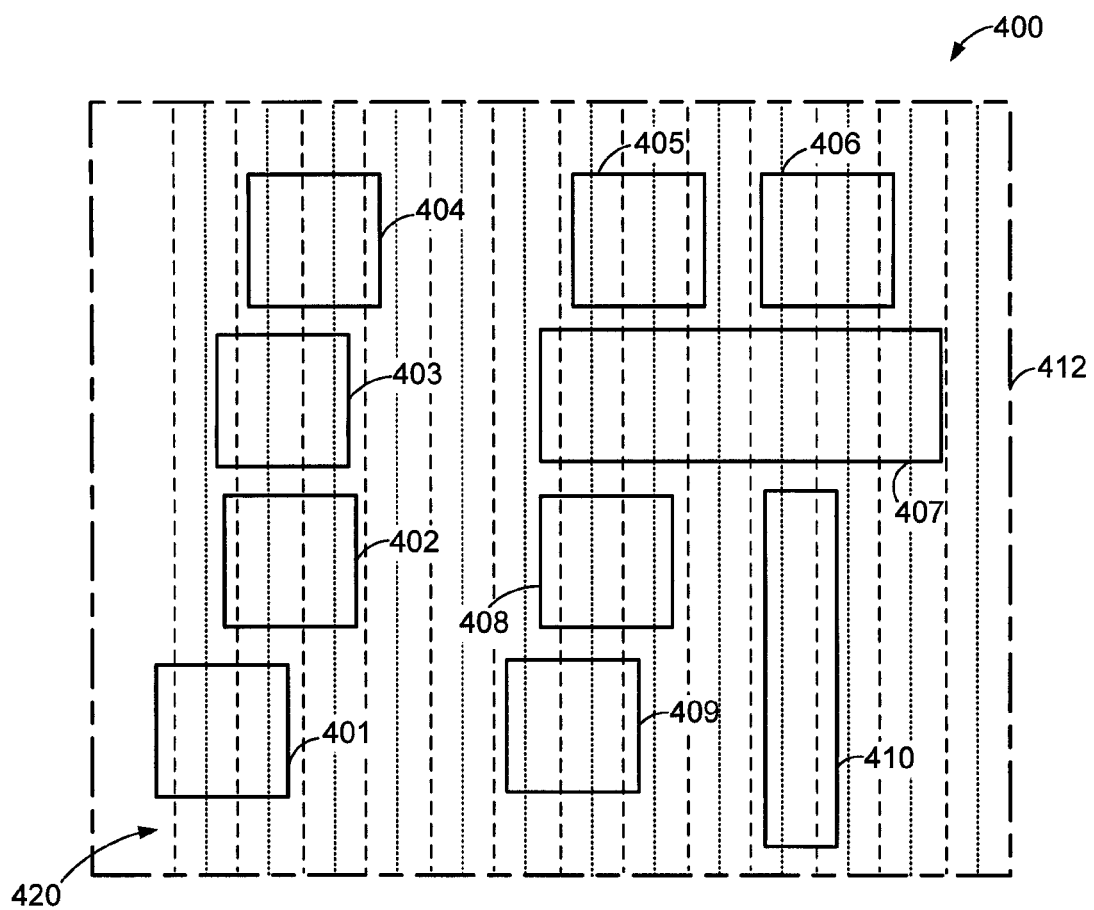
FIG. 4 is a diagram of a particular embodiment of an integrated circuit design having a plurality of macro cells aligned to a virtual power grid.

FIG. 4 is a diagram of a particular embodiment of an integrated circuit (IC) design 400 having a plurality of macro cells 401-410 aligned to a virtual power grid 420, within an IC design boundary 412. The virtual power grid 420 is generated based upon one of the macro cells 401 designated as a reference macro. In an illustrative embodiment, the IC design 400 corresponds to IC design 100 shown in FIG. 1. In comparison to the macro cells 101-110 of FIG. 1, the reference macro 401 is in the same position as the macro cell 101, while the macro cells 402-410 have been moved relative to the corresponding macro cells 102-110. The macro cells 402-410 have been aligned to the virtual power grid 420 generated based upon the position, orientation, and pitch of the reference macro 401. Although FIGS. 1-4 depict vertical power and ground lines of macro cells and the virtual grid for ease of illustration and explanation, automatic alignment of horizontal power and ground lines of macro cells to horizontal power and ground lines of a virtual grid may also be performed, concurrently or sequentially with aligning to vertical power and ground lines.

For some IC designs it may be desirable not to align one or more macro cells to the virtual power grid. For example, for some IC designs, if a macro cell is aligned to the closest line of the virtual grid having the same orientation, the alignment would result in a channel (spacing between macro cells) that is undesirably small, but if the macro cell is aligned to the next line of the virtual grid having the same orientation, the alignment would result in a channel that is undesirably large. Or, for some IC designs, a plurality of macro cells may be clustered in a portion of the IC design sufficiently distant from other macro cells that a global alignment with distant macro cells is unwarranted. In such cases, in a particular embodiment, after a global alignment is effected, unaligned macro cells are examined and aligned through a local alignment. In a particular embodiment, a second virtual grid is generated and macro cells of a localized portion of the IC design are aligned to the second virtual grid.

Figure 5:
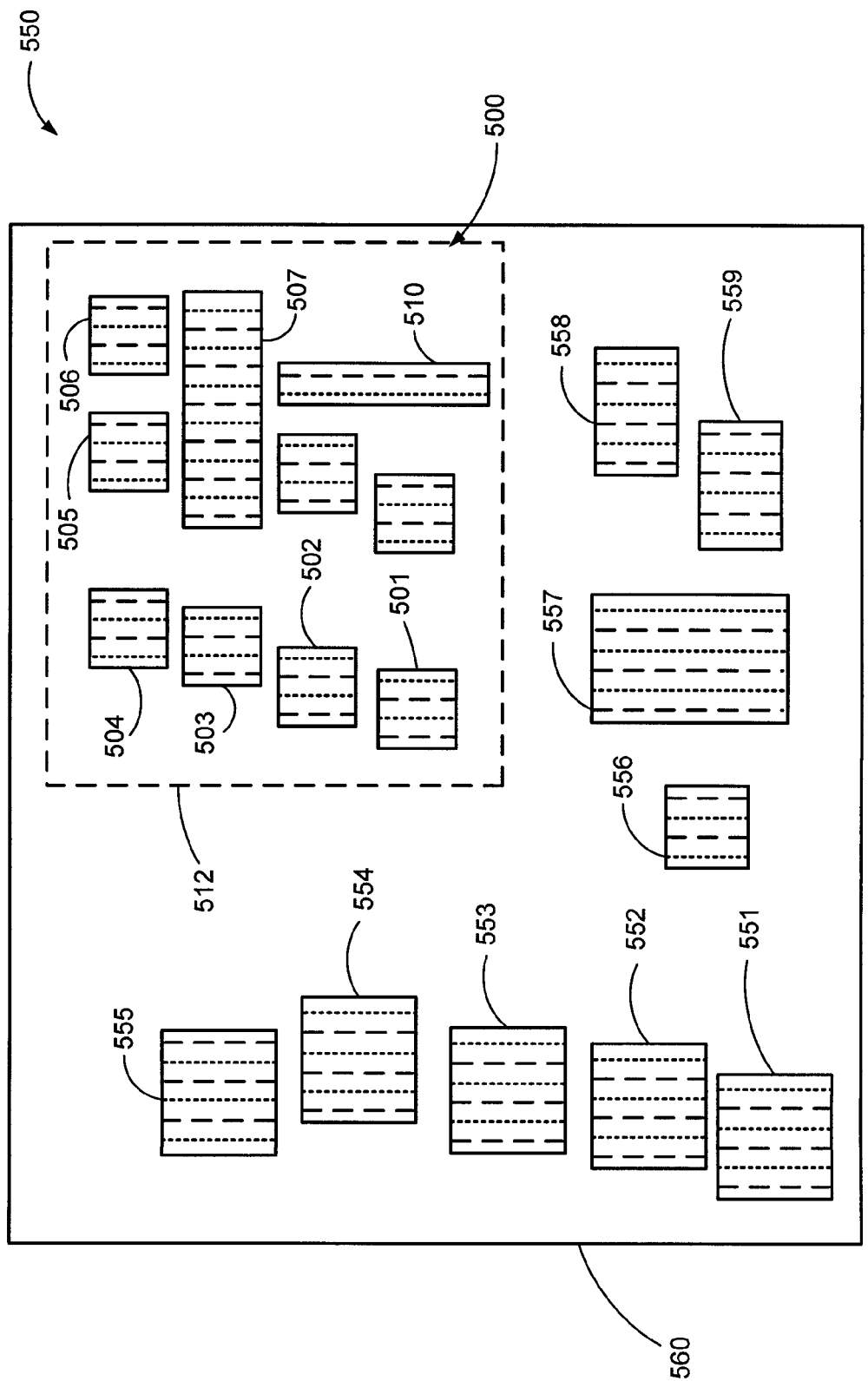
FIG. 5 is a diagram of a particular embodiment of an integrated circuit design having a plurality of macro cells.

FIG. 5 is a diagram of a particular embodiment of an integrated circuit (IC) design 550 having a plurality of macro cells. Macro cells 501-510 and 551-559 are within a boundary 560. The macro cells 501-510 are located in a cluster 500 of the IC design 550 within a boundary 512.

Macro cells 552-559 may be aligned to a first virtual grid (not shown) based on a first reference macro 551 and macro cells 502-510 may be aligned to a second virtual grid (not shown) based on a second reference macro 501. In a particular embodiment, a macro cell (e.g., 551) of the IC design 550 that is not within cluster 500 is designated as a reference macro and a first virtual power grid (not shown) is generated based upon the position, orientation, and pitch of the reference macro. A global alignment of the macro cells not in the cluster 500 (e.g., 552-559) to the first virtual power grid (not shown) is effected. This alignment enables an efficient power connection process between the internal power grids of the macro cells of the IC design 550 that are not within cluster boundary 512 (i.e., reference macro cell 551 and the macro cells 552-559). A second macro cell (e.g., 501) from among the cluster 500 (i.e., macro cells 501-510) may be designated as a second reference macro and a second virtual power grid (not shown) is generated based upon the position, orientation, and pitch of the second reference macro. A local alignment of the macro cells within the cluster 500 to the second virtual power grid (not shown) may enable an efficient power connection process between the internal power grids of the macro cells within the cluster boundary 512 (i.e., the reference macro cell 501 and the macro cells 502-510).

As shown in FIG. 5, the macro cell 551 may be designated as the first reference macro and the macro cell 501 may be designated as the second reference macro. As described above, a first virtual power grid may be automatically generated based upon the detected position, orientation, and pitch of the first reference macro 551 and a global alignment of the macro cells to the first virtual power grid may be effected. A second virtual power grid may be automatically generated based upon the detected position, orientation, and pitch of the second reference macro 501 and a local alignment of the clustered macro cells 502-510 to the second virtual power grid may be effected.

Figure 6:
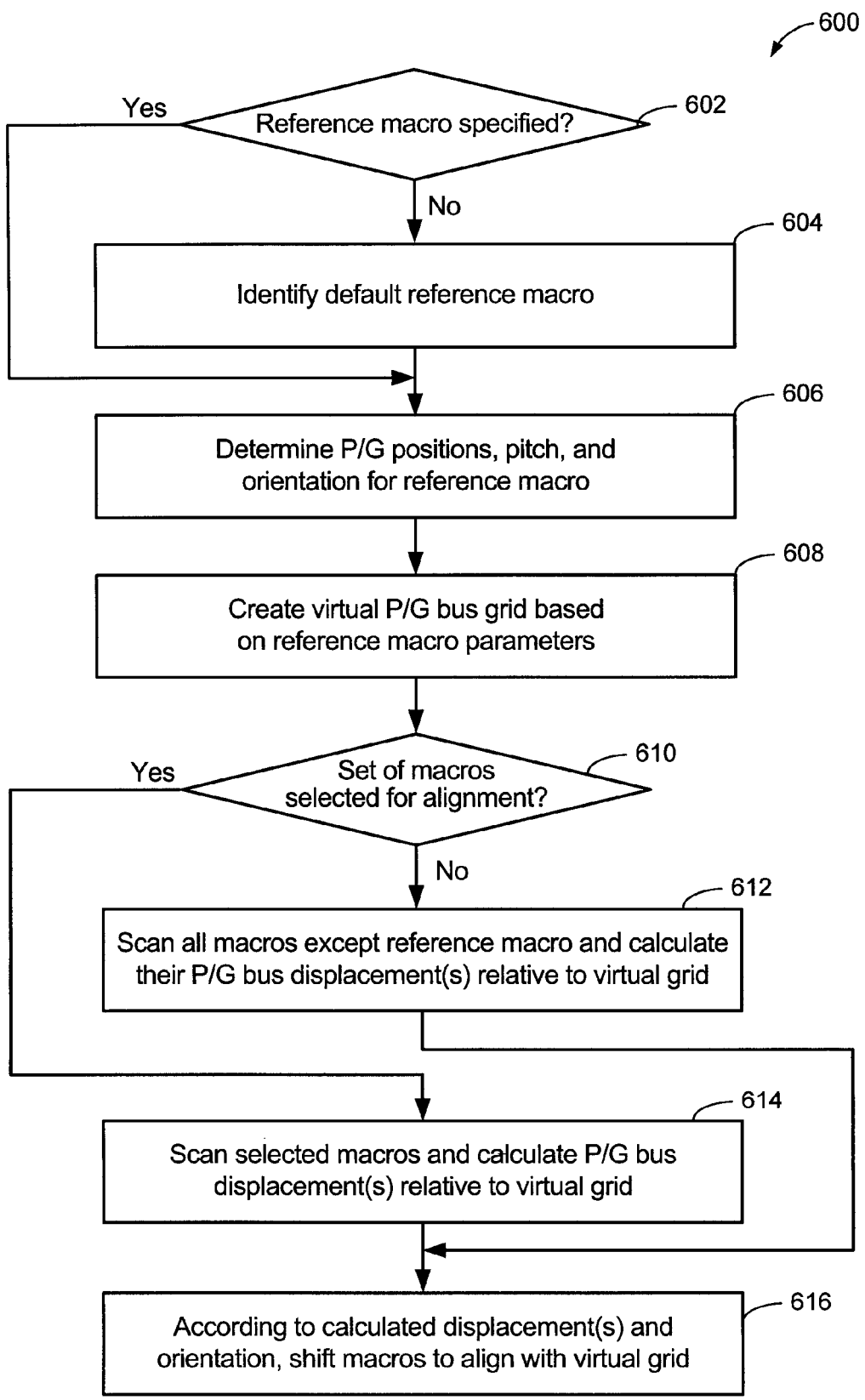
FIG. 6 is a flowchart depicting a particular embodiment of a method of automatically aligning macro cells.

FIG. 6 is a flowchart depicting a particular embodiment of a method 600 of automatically aligning macro cells. The method 600 begins at 602 in which a determination is made whether a user has designated a macro cell as the reference macro. Proceeding to 604, where a user-specified designation has not been made, a default designation of the reference macro may be made. For example, the lower left most macro, such as the macro 101 of FIG. 1, may be selected by default. In a particular embodiment, a user-specified set of one or more parameters representing a virtual reference macro can be provided without designating a reference macro.

Moving to 606, a position, orientation and pitch of the reference macro are determined. For example, the position may be the distance of the reference macro from an integrated circuit (IC) design boundary, the orientation may correspond to whether a power line or a ground line is the leftmost of the reference macro cell, and the pitch may be either, or both, of a power-to-power pitch or a power-to-ground pitch of the reference macro.

Advancing to 608, a virtual grid is automatically generated based on the position, orientation and pitch of the reference macro. For example, the virtual grid may be the virtual power grid 200 of FIG. 2, based on the reference macro 101. A virtual grid can also be automatically generated based upon the user-specified set of parameters for a virtual reference macro.

Proceeding to 610, a determination is made whether a set of macro cells has been selected for alignment. For example, as discussed above, a clustered subset of the macro cells of an IC design may be selected for alignment, such as the macros 501-510 in the cluster 500 depicted in FIG. 5.

Where a set of macro cells has not been selected for alignment then, at 612, all macro cells other than the reference macro may be scanned and an orientation and a displacement of the internal power grid of each of the macro cells may be detected and calculated, respectively.

Proceeding to 616, each macro cell may be shifted, according to the calculated displacement corresponding to the particular macro cell, to align to the virtual grid.

Where a set of macro cells has been selected for alignment at 610 then, at 614, each of the selected macro cells is scanned, and an orientation and a displacement of the internal power grid of each of the selected set of macro cells is detected and calculated, respectively. Proceeding to 616, each selected macro cell is shifted, according to the calculated displacement corresponding to the particular macro cell, to align to the virtual grid.

Figure 7:
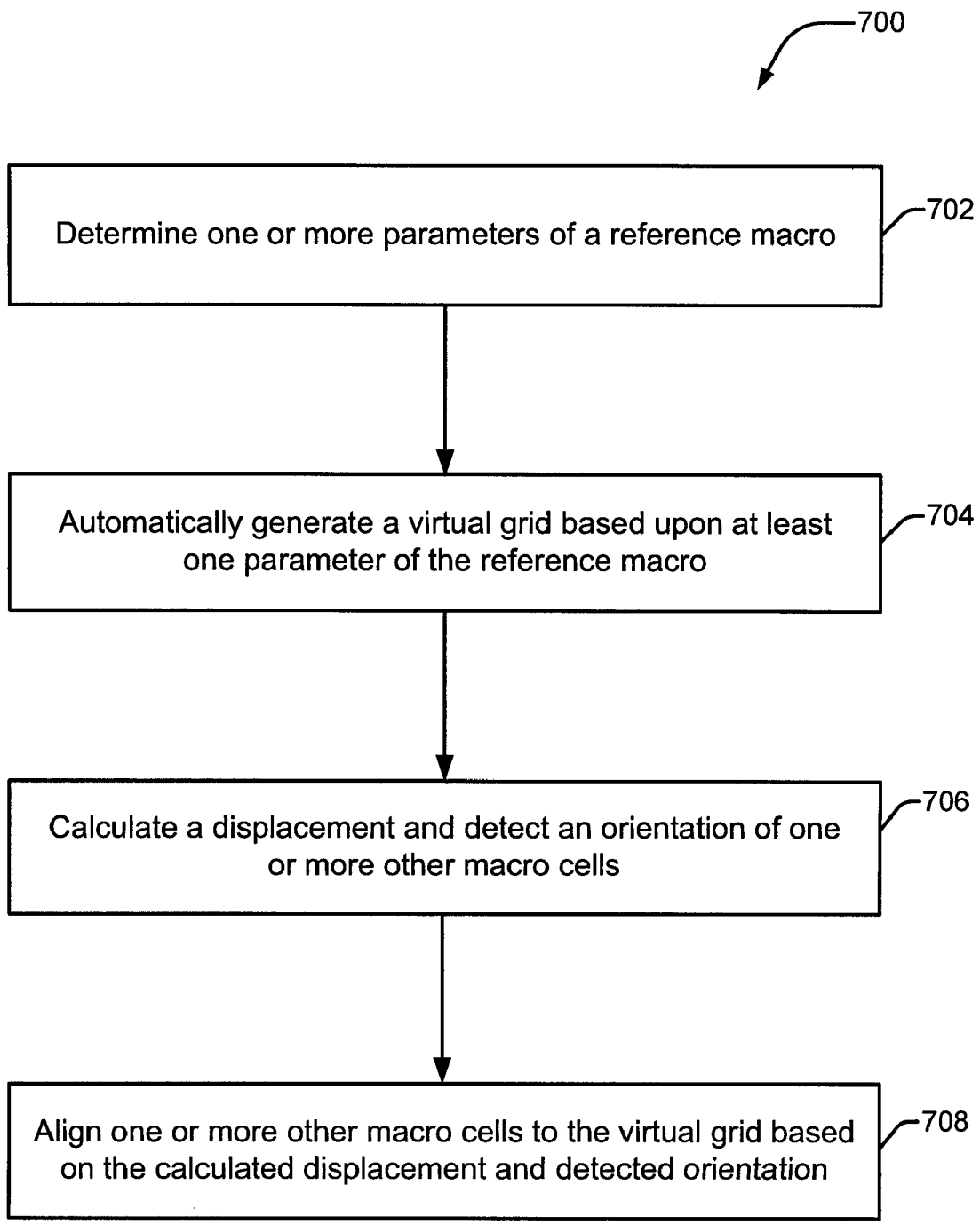
FIG. 7 is a flowchart depicting another particular embodiment of a method of automatically aligning macro cells.

FIG. 7 is a flowchart depicting another particular embodiment of a method of automatically aligning macro cells. The method 700 begins at 702 in which one or more parameters of a reference macro cell are determined. For example, the reference macro cell may be selected from among a plurality of macro cells of an integrated circuit (IC) design. Proceeding to 704, a virtual grid, based upon at least one of the parameters of the reference macro, may be automatically generated.

Moving to 706, a displacement and an orientation of one or more other macro cells of the IC design may be calculated and detected. For example, the orientation may be determined based on whether a power line or ground line is the leftmost of the macro cell. The displacement may indicate a distance from one or more lines of the virtual grid.

Advancing to 708, one or more other macro cells may be aligned to the virtual grid based upon the calculated displacement and the detected orientation. For example, where the orientation of the macro cell is the same as the orientation of the virtual grid, the macro cell may be immediately aligned. Where the orientation of the macro cell is not the same as the virtual grid, a different displacement may be made in consideration of the orientation of the macro cell, and the macro cell may then be aligned using the different displacement.

Figure 8:
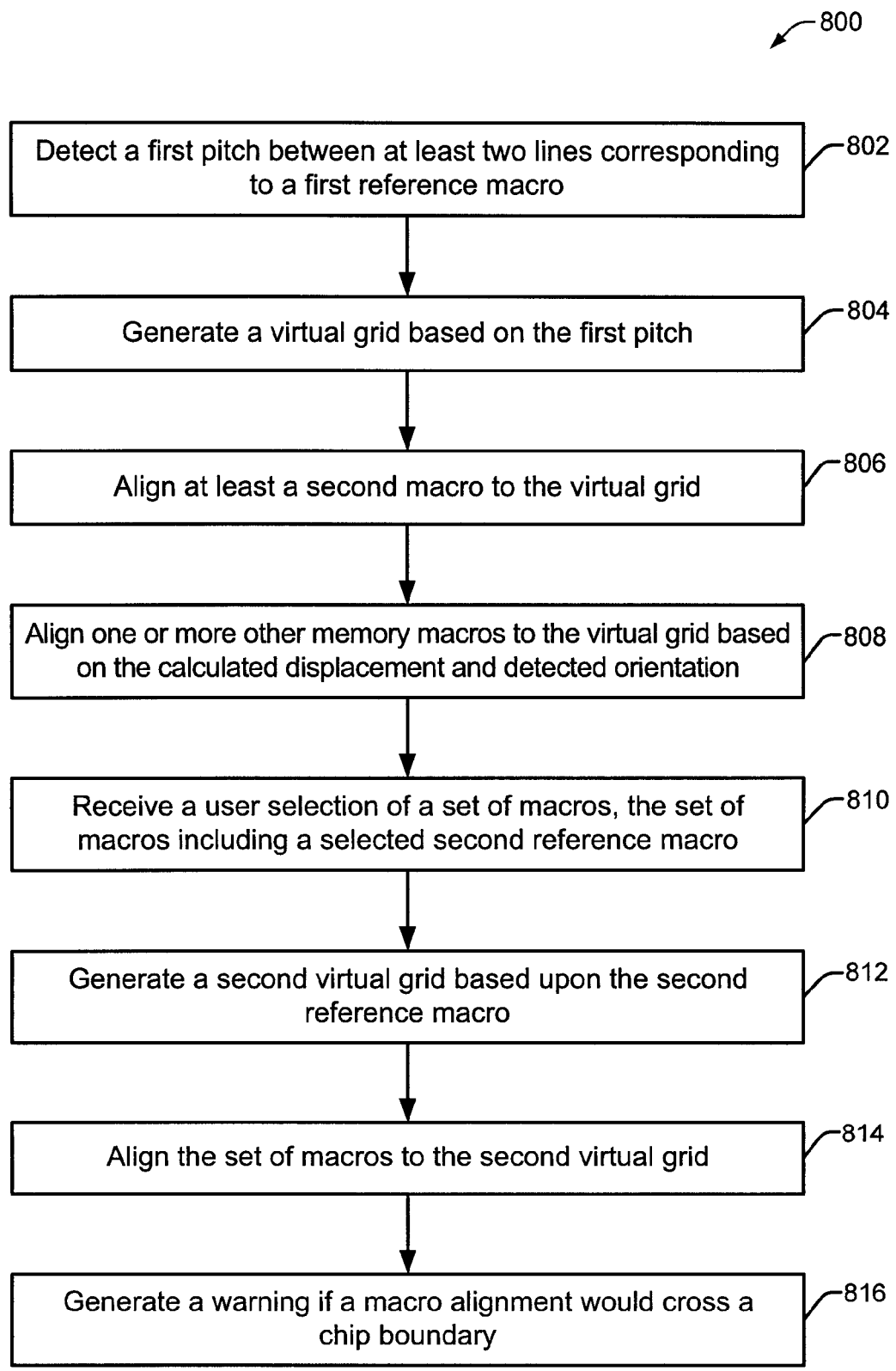
FIG. 8 is a flowchart depicting another particular embodiment of a method of automatically aligning macro cells.

FIG. 8 is a flowchart depicting another particular embodiment of a method 800 of automatically aligning macro cells. At 802, a first pitch between at least two lines corresponding to a first reference macro is detected. In a particular embodiment, the first pitch includes a distance between a first power line of the reference macro and a first ground line of the reference macro. In another embodiment, the first pitch includes a distance between a first power line of the reference macro and a second power line of the reference macro.

The reference macro may be a user-selected macro or may be automatically determined by default. For example, the reference macro may be automatically determined to be a lower left macro by default. As another example, a default selection of a reference macro may be based on position, size, type, other factors, or any combination thereof. In a particular embodiment, a determination may first be made whether a user selection of a reference macro has been made, and when a user selection is not detected, a default reference macro may be selected. In another particular embodiment, a virtual reference macro can be designated by a user specified set of parameters.

Advancing to 804, a virtual grid is generated based on the first pitch. For example, in a particular embodiment, the virtual grid may be aligned to overlap the internal power network lines of the reference macro. In another embodiment, the virtual grid may be generated based on a default alignment, such as having a specified one of a power line or a ground line coincident with a particular boundary or at a predetermined or calculated displacement from the particular boundary, from the center, or from any other designated location, while exhibiting line spacing corresponding to the first pitch of the first reference macro. In such an embodiment, the virtual grid may be generated without determining or calculating a position or an orientation, or both, of the first reference macro or the internal power network of the first reference macro.

Proceeding to 806, at least a second macro is aligned to the virtual grid. In a particular embodiment, a displacement of the second macro from the virtual grid may be determined and the determined displacement may be used to align the second macro to the virtual grid. However, in another embodiment, the second macro may be aligned to the virtual grid without determining or computing a displacement of the second macro or the internal power network of the second macro to a virtual grid line. For example, where a position of the second macro is determined by a coordinate location of a reference point of the second macro, such as a lower-right corner, a center, a leftmost power line, or other reference point of the second macro, the second macro may be aligned with the virtual grid by changing the coordinate location of the reference point to a new location where the internal lines of the second macro align with the virtual grid. Such a displacement may be performed without determining an original displacement of the second macro to the virtual grid.

In a particular embodiment, a user selection of a second reference macro is received, a displacement of the second reference macro from the virtual grid may be determined, and at least a third macro may be realigned in response to the displacement of the second reference macro. In general, multiple macros may be realigned based on a selected second reference macro.

Continuing to 810, in a particular embodiment, a user selection of a set of macros is received. The set of macros may include the selected second reference macro. Moving to 812, a second virtual grid may be generated based upon the second reference macro. Advancing to 814, the set of macros may be aligned to the second virtual grid.

Proceeding to 814, in a particular embodiment, a warning may be generated if a macro alignment would cross a chip boundary. For example, a chip boundary may be checked prior to aligning a macro, and where aligning the macro would cause at least a portion of the macro to cross the chip boundary, the warning may be generated. For example, in a particular embodiment, the warning may include a return value of a software process executed by a processor configured to perform electronic design automation (EDA). In another embodiment, the warning may include an entry stored to an output data file or log file stored at a memory accessible to the processor. In yet another embodiment, the warning may include a visual or audible warning generated to be perceived by a user, such as via a graphical user interface associated with an EDA process executed at the processor.

Figure 9:
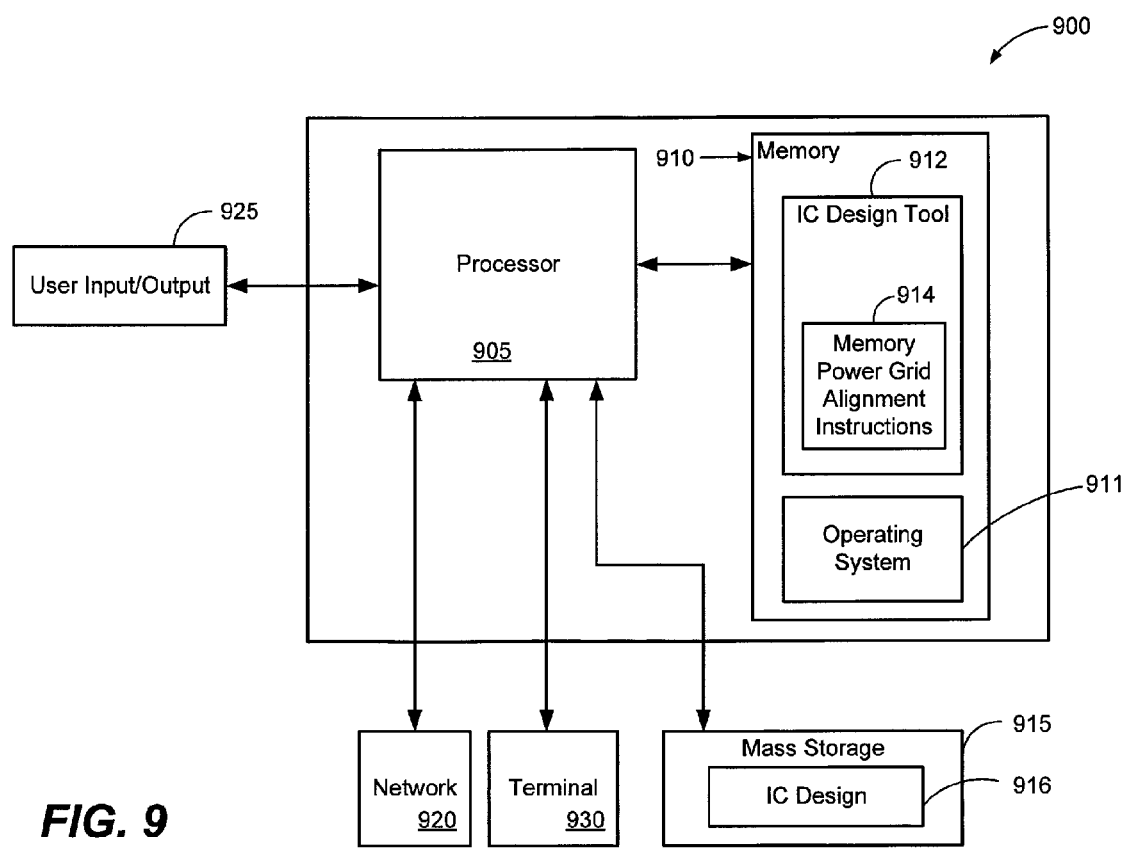
FIG. 9 is a block diagram of a particular embodiment of a system to automatically align macro cells.

As noted above, embodiments may be implemented as functionality of an IC design tool. FIG. 9 illustrates a hardware and software system 900 supporting an integrated circuit design tool to implement automatic memory bus alignment functionality. System 900 may represent practically any type of computer, computer system or other programmable electronic device, including a client computer, a server computer, an embedded controller, etc. Moreover, system 900 may be implemented using one or more networked computers or other distributed computing system. System 900 includes at least one processor 905 coupled to a memory 910. Processor 905 may represent one or more processors (e.g., microprocessors), and memory 910 may represent random access memory (RAM) devices comprising the main storage of apparatus 900, as well as any supplemental levels of memory, e.g., cache memories, non-volatile or backup memories (e.g., programmable or flash memories, read-only memories, etc.) In addition, the memory 910 may be considered to include memory storage physically located elsewhere, for example, any cache memory in the processor 905, as well as any storage capacity used as a virtual memory, e.g., as stored on a mass storage device 915 or on another system coupled to the system 900 via a network 920.

The system 900 also typically receives a number of inputs and outputs for communicating information externally. To interface with a user or operator, the system 900 may include one or more user input/output devices 925 (e.g., for input, a keyboard, a mouse, a trackball, a touchpad, and/or a microphone; and for output, a monitor, a liquid crystal display (LCD) panel, and/or a speaker, among others). Otherwise, user input may be received via a remote terminal or workstation 930, and/or via another computer over the network 920.

For additional storage, the system 900 may also include one or more mass storage devices 915, e.g., a floppy or other removable disk drive, a hard disk drive, a direct access storage device (DASD), an optical drive (e.g., a compact disc (CD) drive, a digital video disc (DVD) drive, etc.), among others. The system 900 may also include an interface with one or more networks 920 to permit the communication of information with other computers coupled to the network.

The system 900 may be a multi-user computer such as a server, midrange computer, a mainframe computer, with user input and output conducted with circuit designers and testers via one or more external computers coupled to the system 900 via a terminal or a networked computer.

The system 900 may operate under the control of an operating system 911, and executes or otherwise relies upon various computer software applications and programs including an integrated circuit design tool 912. The integrated circuit design tool 912 includes macro cell power grid alignment instructions 914 that are executable by the processor 905 to effect automatic alignment of macro cell power and ground buses in accordance with various embodiments as described herein.

In a particular embodiment, the macro cell power grid alignment instructions 914 may be executable to configure the processor 905 to operate substantially in accordance with one or more methods as depicted in FIGS. 6-8, such as to develop and test an integrated circuit design 916 (shown resident in mass storage 915) suitable for use in manufacturing an integrated circuit device. However, it should be appreciated that the various functions associated with designing and testing an integrated circuit may be handled by different programs executed by processors that collectively represent the functionality of integrated circuit design tool 912 of FIG. 9. Moreover, it will be appreciated that integrated circuit design 916 may include one or more design files incorporating any number of different formats as may be appropriate for various stages during the integrated circuit design process.

In a particular embodiment, the integrated circuit design tool 912 may be used to at least partially form an integrated circuit device. For example, the integrated circuit design tool 912 may be used to generate an integrated circuit design that may include a first set of macro cells. Each macro cell of the first set of macro cells may have an internal power grid that is aligned to a first virtual grid based on a first pitch of a first particular macro cell of the first set of macro cells. The integrated circuit design may also include a second set of macro cells. Each macro cell of the second set of macro cells may have an internal power grid that is aligned to a second virtual grid based on a second pitch of a second particular macro cell of the second set of macro cells. In an illustrative embodiment, the integrated circuit design may be generated by automatically aligning the first set of macro cells to the first virtual grid and the second set of macro cells to the second virtual grid, in a manner such as illustrated with respect to any of FIGS. 1-5, according to the methods of any of FIGS. 6-8, or any combination thereof. For example, the first set of macro cells may be the macros 501-510 and the second set of macro cells may be the macros 511-520 that are aligned as discussed with respect to FIG. 5. The integrated circuit design may be used to form the integrated circuit device or to control a process that forms the integrated circuit device.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Embodiments of the invention have been described as processes including various operations. Many of the processes are described in their most basic form, but operations can be added to or deleted from any of the processes for various embodiments. For example, although discussed generally above as including a global alignment based on a first reference macro and a more specific or local alignment based on a user-specified second reference macro, the process may be reiterated to effect alignment to additional virtual grids automatically generated based on the position, orientation, and pitch of additional user-specified or automatically designated reference macros.

As noted above, the steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A the method comprising:
    detecting, at a processor a first pitch between at least two lines of a first reference macro;
    generating a virtual grid based on the first pitch;
    aligning a second macro to the virtual grid;
    receiving a user selection of a second reference macro;
    determining a displacement of the second reference macro from the virtual grid; and
    aligning at least a third macro in response to the displacement of the second reference macro from the virtual grid.

2. The method of claim 1, wherein the at least two lines include power lines or ground lines.

3. The method of claim 1, wherein the first pitch includes a distance between a first power line of the reference macro and a first ground line of the reference macro.

4. The method of claim 1, wherein the first pitch includes a distance between a first power line of the reference macro and a second power line of the reference macro.

5. The method of claim 1, wherein the reference macro is automatically determined by default.

6. The method of claim 5, wherein the reference macro is automatically determined to be a lower left macro within a design boundary.

7. The method of claim 1, wherein the reference macro is a user-selected macro.

8. The method of claim 1, wherein the reference macro is a virtual reference macro that is generated based upon a user-specified set of one or more parameters representing the virtual reference macro.

9. The method of claim 1, wherein a boundary is checked prior to aligning and further comprising generating a warning if a macro alignment would cross the boundary.

10. The method of claim 1, further comprising:
    receiving a user selection of a set of macros, the set of macros including the second reference macro;
    generating a second virtual grid based upon the second reference macro; and
    aligning the set of macros to the second virtual grid.

11. A non-transitory processor-readable medium containing processor executable instructions that are operative to cause the processor to:
    designate a macro cell of a plurality of macro cells of an integrated circuit design as a reference macro;
    determine one or more parameters of the reference macro;
    automatically generate a virtual grid of power lines and ground lines based on the one or more parameters of the reference macro;
    automatically align at least a first macro cell to the virtual grid;
    determine whether one or more macro cells of the plurality of macro cells should not be aligned to the virtual grid;
    receive a user designation of an unaligned macro cell of the one or more macro cells as a second reference macro;
    determine one or more parameters of the second reference macro;
    automatically generate a second virtual grid of power lines and ground lines based on the one or more parameters of the second reference macro; and
    automatically align at least a second macro cell to the second virtual grid.

12. The non-transitory processor-readable medium of claim 11, wherein the one or more parameters of the reference macro include a position, an orientation, and a pitch of the reference macro.

13. The non-transitory processor-readable medium of claim 12, wherein the pitch of the reference macro is determined using a distance between a first power line of the reference macro and a first ground line of the reference macro.

14. The non-transitory processor-readable medium of claim 12, wherein the pitch of the reference macro is determined using the distance between a first power line of the reference macro and a second power line of the reference macro.

15. A the method comprising:
    determining, at a processor one or more parameters of a reference macro, wherein the reference macro is a macro cell of an integrated circuit design;
    generating a virtual grid based upon the one or more parameters of the reference macro;
    aligning one or more macro cells of the integrated circuit design to the virtual grid;
    determining whether at least one macro cell of the integrated circuit design should not be aligned to the virtual grid;
    receiving a user designation of an unaligned macro cell of the at least one macro cell as a second reference macro;
    determining one or more parameters of the second reference macro;
    automatically generating a second virtual grid based on the one or more parameters of the second reference macro; and
    automatically aligning at least one other macro cell to the second virtual grid.

16. The method of claim 15, wherein the one or more parameters of t reference macro include a position, an orientation, and a pitch of the reference macro.

17. The method of claim 16, wherein the one or more other macro cells include a set of macro cells of the integrated circuit design that are selected by a user.

18. The method of claim 15, further comprising:
    calculating a displacement of the one or more macro cells of the integrated circuit design relative to the virtual grid; and
    detecting an orientation of the one or more macro cells of the integrated circuit design relative to the virtual grid, wherein aligning the one or more macro cells to the virtual grid is based on the calculated displacement and the detected orientation.

19. An integrated circuit design tool comprising:
    a processor;
    a memory coupled to the processor, the memory storing macro cell power grid align ent instructions that are executable to cause the processor to:
        designate a macro cell of a plurality of macro cells of an integrated circuit design as a reference macro;
        determine one or more parameters of the reference macro;
        automatically generate a virtual grid of power lines and ground lines based on the one or more parameters of the reference macro;
        automatically align at least a first macro cell to the virtual grid;
        determine whether one or more macro cells of the plurality of macro cells should not be aligned to the virtual grid;
        receive a user designation of an unaligned macro cell of the one or more macro cells as a second reference macro;
        determine one or more parameters of the second reference macro;

automatically generate a second virtual grid of power lines and ground lines based on the one or more parameters of the second reference macro; and automatically align at least a second macro cell to the second virtual grid.

20. The integrated circuit design tool of claim 19, wherein the one or more parameters of the reference macro include a position, an orientation, and a pitch of the reference macro.

21. The integrated circuit design tool of claim 19, wherein the at least one other macro cell includes a set of macro cells of the integrated circuit design that are selected by a user.

22. A device including an integrated circuit that is at least partially formed using a integrated circuit design tool, the integrated circuit design tool comprising:

a processor; and a memory coupled to the processor, the memory storing macro cell power grid alignment instructions that are executable to cause the processor to:

designate a macro cell of a plurality of macro cells of an integrated circuit design as a reference macro;

determine one or more parameters of the reference macro;

automatically generate a virtual grid of power lines and ground lines based on the one or more parameters of the reference macro;

automatically align at least a first macro cell to the virtual grid;

determine whether one or more macro cells of the plurality of macro cells should not be aligned to the virtual grid;

receive a user designation of an unaligned macro cell of the one or more macro cells as a second reference macro;

determine one or more parameters of the second reference macro;

automatically generate a second virtual grid of power lines and ground lines based on the one or more parameters of the second reference macro; and automatically align at least a second macro cell to the second virtual grid.

23. A non-transitory processor-readable medium containing processor executable instructions that are operative to cause the processor to:

detect a first pitch between at least two lines of a first reference macro;

generate a virtual grid based on the first pitch;

align a second macro to the virtual grid;

receive a user selection of a second reference macro;

determine a displacement of the second reference macro from the virtual grid;

align a third macro in response to the displacement of the second reference macro from the virtual grid.

24. The non-transitory processor-readable medium of claim 23, wherein the at least two lines include power lines or ground lines.

25. The non-transitory processor-readable medium of claim 23, wherein the first pitch includes a distance between a first power line of the reference macro and a first ground line of the reference macro.

26. The non-transitory processor-readable medium of claim 23, wherein the first pitch includes a distance between a first power line of the reference macro and a second power line of the reference macro.

27. The non-transitory processor-readable medium of claim 23, wherein the reference macro is automatically determined by default.

\* \* \* \* \*